(12) United States Patent
Seo et al.

(10) Patent No.: US 11,896,997 B2
(45) Date of Patent: Feb. 13, 2024

(54) WINDOW AND METHOD FOR MANUFACTURING THE SAME

(71) Applicant: Samsung Display Co., Ltd., Yongin-si (KR)

(72) Inventors: Hyunseung Seo, Suwon-si (KR); Jihyun Ko, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 6 days.

(21) Appl. No.: 17/533,811

(22) Filed: Nov. 23, 2021

(65) Prior Publication Data
US 2022/0305527 A1    Sep. 29, 2022

(30) Foreign Application Priority Data

Mar. 26, 2021  (KR) .................. 10-2021-0039971

(51) Int. Cl.
*B05D 1/32*    (2006.01)
*B05D 5/00*    (2006.01)
(Continued)

(52) U.S. Cl.
CPC .............. *B05D 5/00* (2013.01); *B05D 1/32* (2013.01); *B05D 7/54* (2013.01); *C03C 17/3411* (2013.01);
(Continued)

(58) Field of Classification Search
CPC ... B05D 1/32; B05D 5/00; B05D 7/54; B05D 2201/02; B05D 2203/35; B05D 2601/22; B32B 9/00; B32B 9/04; B32B 9/005; B32B 9/045; B32B 17/00; B32B 17/04; B32B 17/06; B32B 27/00; B32B 27/06; B32B 33/00; B32B 7/023; B32B 38/1816; B32B 2255/00; B32B 2457/20; C03C 17/3411;
(Continued)

(56) References Cited

U.S. PATENT DOCUMENTS 10,436,945 B2    10/2019    Hart et al.
10,508,183 B2    12/2019    Lee et al.
(Continued)

FOREIGN PATENT DOCUMENTS

| KR | 10-1828516 | 2/2018 |
| KR | 10-1950564 | 2/2019 |
| KR | 10-2020-0014036 | 2/2020 |

OTHER PUBLICATIONS

W. Moćko et al., "Simulation of nanoindentation experiments of single-layer and double-layer thin films using finite element method", Surface and Interface Analysis, Apr. 10, 2014, pp. 1071-1076, vol. 46.

*Primary Examiner* — Humera N. Sheikh
*Assistant Examiner* — Kevin C T Li
(74) *Attorney, Agent, or Firm* — KILE PARK REED & HOUTTEMAN PLLC

(57) ABSTRACT

A window includes a base substrate including a planar portion and a curved portion surrounding at least a part of the planar portion, a front cover layer disposed on the base substrate, a flat cover layer overlapping the planar portion and disposed on the base substrate, and a bending cover layer overlapping the curved portion and disposed on the base substrate. The front cover layer and the bending cover layer each include an inorganic material.

23 Claims, 12 Drawing Sheets

(51) Int. Cl.
  *B05D 7/00* (2006.01)
  *C03C 17/34* (2006.01)
(52) U.S. Cl.
  CPC ...... *B05D 2201/02* (2013.01); *B05D 2203/35* (2013.01); *C03C 2217/213* (2013.01); *C03C 2217/214* (2013.01); *C03C 2217/281* (2013.01); *C03C 2217/73* (2013.01); *C03C 2218/34* (2013.01)
(58) Field of Classification Search
  CPC .......... C03C 17/3435; C03C 2217/214; C03C 2217/281; C03C 2217/73; C03C 2217/734; C03C 2218/34; C23C 14/042; G09F 9/301
  See application file for complete search history.

(56) References Cited

U.S. PATENT DOCUMENTS

2018/0011225 A1* 1/2018 Bellman .................. G02B 1/14
2019/0079339 A1* 3/2019 Fujii ...................... G02B 1/115

* cited by examiner

WINDOW AND METHOD FOR MANUFACTURING THE SAME

CROSS-REFERENCE TO RELATED APPLICATION(S)

This application claims priority to and benefits of Korean Patent Application No. 10-2021-0039971 under 35 U.S.C. § 119, filed on Mar. 26, 2021, in the Korean Intellectual Property Office, the entire contents of which are incorporated herein by reference.

BACKGROUND

Embodiments of the disclosure described herein relate to a window with improved durability and a method of manufacturing the same.

Display devices for use in multimedia devices such as televisions, mobile phones, navigation systems, computer monitors, and game consoles have been developed. The display devices may include a display panel for providing an image with information to a user and a window for protecting the display panel.

As various types of display devices are used, various types of windows are also required. Recently, as display devices with curved surfaces are being developed, demand for a window including a curved surface has increased in response. Accordingly, the curved surface of the window should have reliability against external impacts.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments of the disclosure improve the durability of a window including a curved surface.

According to an embodiment, a window may include a base substrate including a planar portion and a curved portion surrounding at least a part of the planar portion, a front cover layer disposed on the base substrate, a flat cover layer overlapping the planar portion and disposed on the base substrate, and a bending cover layer overlapping the curved portion and disposed on the base substrate. The front cover layer and the bending cover layer may each include an inorganic material.

The front cover layer may be disposed between the base substrate and the flat cover layer and between the base substrate and the bending cover layer.

The window may further include an anti-reflection layer disposed between the base substrate and the front cover layer.

The window may further include a functional layer disposed on the flat cover layer and the bending cover layer, wherein the functional layer may include at least one of an anti-fingerprint layer and an antistatic layer.

The window may further include a lower cover layer overlapping the curved portion and disposed below the base substrate, wherein the lower cover layer may include an inorganic material.

The window may further include a coating layer disposed below the planar portion and the lower cover layer.

The front cover layer may be disposed on the flat cover layer and the bending cover layer.

The window may further include an anti-reflection layer disposed between the base substrate and the flat cover layer and between the base substrate and the bending cover layer.

The window may further include a functional layer disposed on the front cover layer, wherein the functional layer may include at least one of an anti-fingerprint layer and an antistatic layer.

The window may further include a lower cover layer overlapping the curved portion and disposed below the base substrate, wherein the lower cover layer may include an inorganic material.

The flat cover layer may include layers having different refractive indices, and the layers of the flat cover layer may be alternately disposed.

A sum of a hardness of the front cover layer and a hardness of the bending cover layer may be about 8 GPa or more.

Each of the front cover layer, the flat cover layer, and the bending cover layer may have a thickness in a range of about 500 nm and about 5000 nm.

The base substrate may define a first extension line extending a boundary surface between the planar portion and the curved portion and a second extension line extending a side surface of the base substrate, and an angle formed by the first extension line and the second extension line may be about 90 degrees or less.

A thickness of the curved portion may vary as a distance from the planar portion varies.

The inorganic material may include one of silicon nitride, silicon oxide, and aluminum oxide.

According to an embodiment, a method of manufacturing a window may include providing a base substrate including a planar portion and a curved portion which surrounds at least a part of the planar portion, forming a front cover layer covering the planar portion and the curved portion, forming a flat cover layer on the front cover layer using a first mask including a first opening that overlaps the planar portion, the flat cover layer overlapping the planar portion, and forming a bending cover layer on the front cover layer using a second mask including a second opening that overlaps at least a part of the curved portion, the bending cover layer overlapping the curved portion.

The front cover layer and the bending cover layer may each include an inorganic material, and a hardness of the curved portion may be greater than a hardness of the planar portion.

The forming of the flat cover layer may include forming layers having different refractive indices, and disposing the layers of the flat layer alternately with each other.

A sum of a hardness of the front cover layer and a hardness of the bending cover layer may be about 8 GPa or more.

BRIEF DESCRIPTION OF THE DRAWINGS

The above and other objects and features of the disclosure will become apparent by describing in detail embodiments thereof with reference to the accompanying drawings.

DETAILED DESCRIPTION OF THE EMBODIMENTS

Figure 1A:
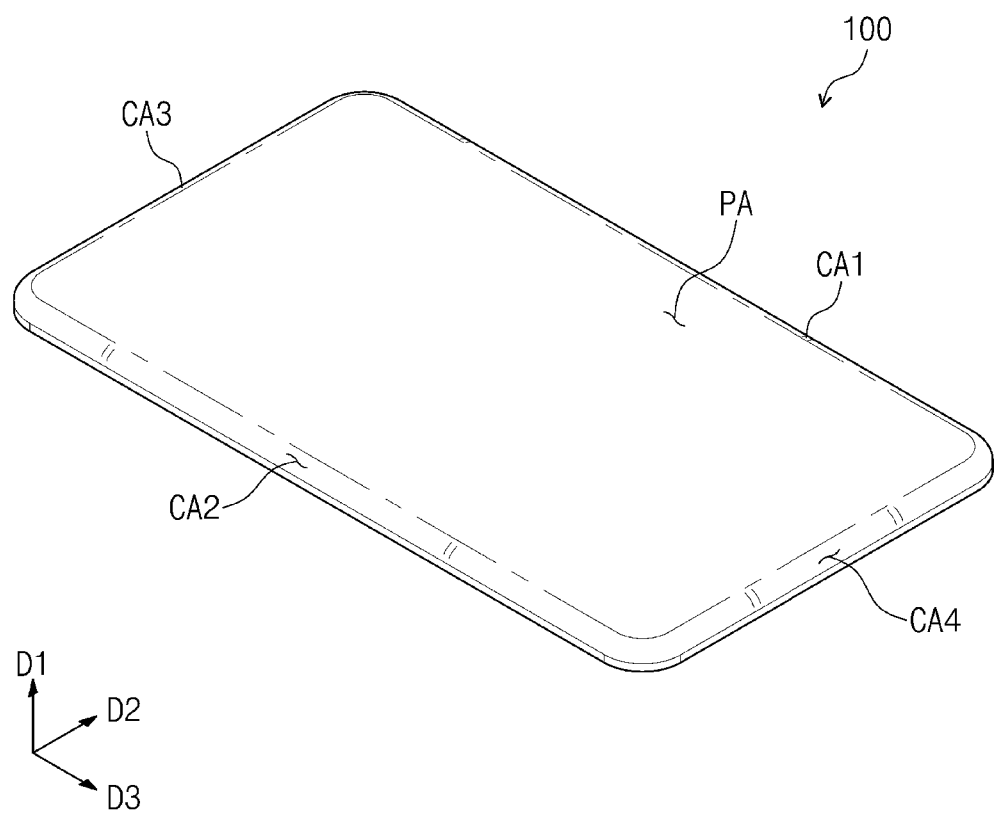
FIG. 1A is a schematic perspective view of a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the specification, when one component (or area, layer, part, or the like) is referred to as being "on", "below", "connected to", or "coupled to" another component, it should be understood that the former may be directly on, below, connected to, or coupled to the latter, and also may be on, below, connected to, or coupled to the latter with a third intervening component.

Like reference numerals refer to like components. Also, in drawings, the thickness, ratio, and dimension of components are exaggerated for effectiveness of description of technical contents.

The terms "first", "second", and the like are used to describe various components, but the components are not limited by the terms. The terms are used only to differentiate one component from another component. For example, a first component may be named as a second component, and vice versa, without departing from the spirit or scope of the disclosure. A singular form, unless otherwise stated, includes a plural form.

Also, the terms "under", "beneath", "on", "above" are used to describe a relationship between components illustrated in a drawing. The terms are relative and are described with reference to a direction indicated in the drawing.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Hereinafter, embodiments of the disclosure will be described with reference to the drawings.

Figure 1B:
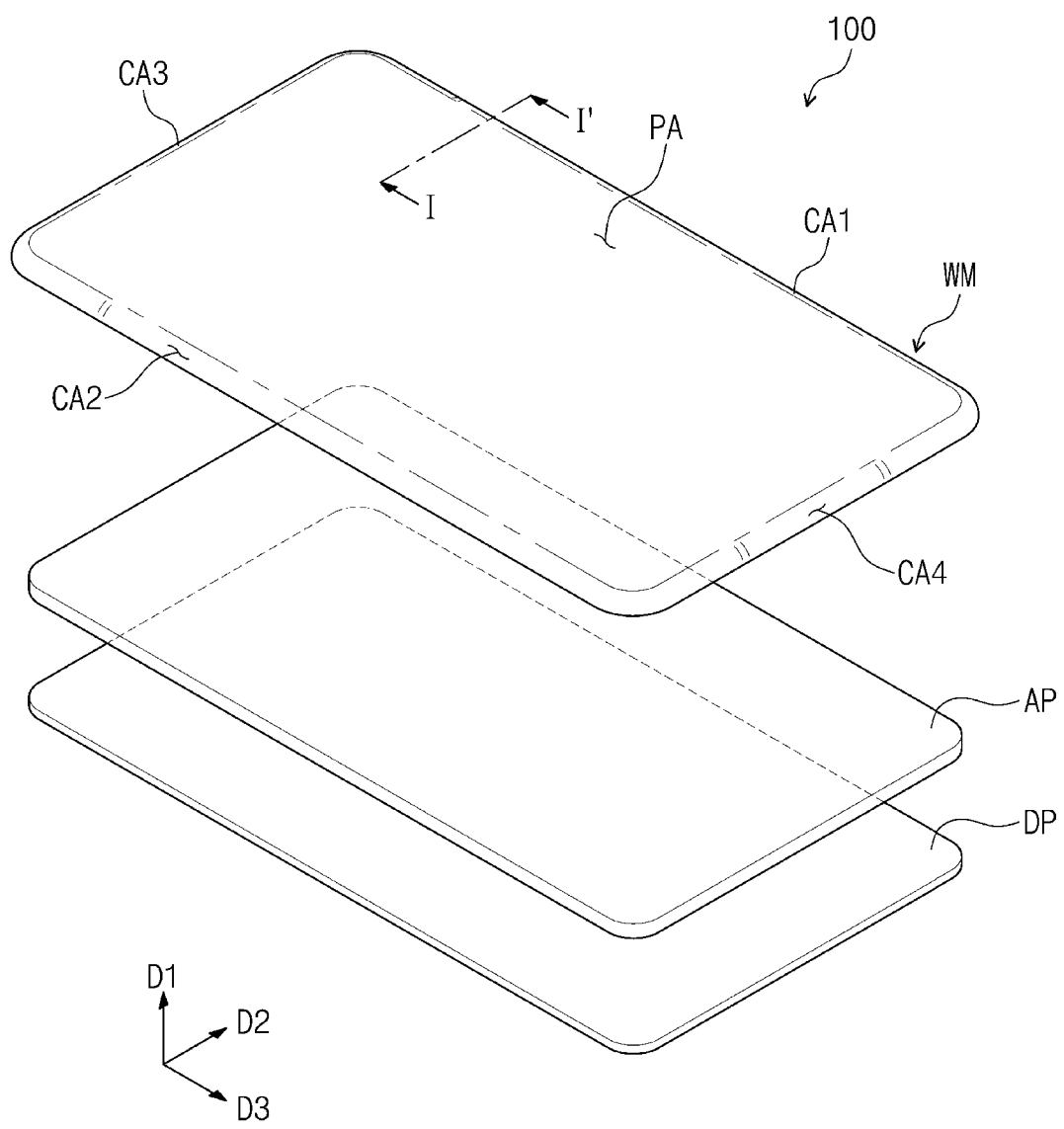
FIG. 1B is an exploded schematic perspective view illustrating a partial configuration of a display device according to an embodiment of the disclosure.

FIG. 1A is a schematic perspective view of a display device 100 according to an embodiment of the disclosure FIG. 1B is an exploded schematic perspective view illustrating a partial configuration of the display device 100 according to an embodiment of the disclosure.

Referring to FIG. 1A, the display device 100 may be a device that is activated in response to an electrical signal. For example, the display device 100 may be a mobile phone, a tablet, a car navigation system, a game console, or a wearable device, but is not limited thereto. In FIGS. 1A and 1B, it is illustrated that the display device 100 is a mobile phone.

The display device 100 may be defined with a planar area PA and first to fourth curved areas CA1, CA2, CA3, and CA4. The planar area PA may be substantially parallel to a plane defined by second and third directions D2 and D3. A first direction D1 intersecting both the second direction D2 and the third direction D3 may be defined as a thickness direction of the display device 100.

The first to fourth curved areas CA1, CA2, CA3, and CA4 may be bent from the planar area PA. The planar area PA and the first to fourth curved areas CA1, CA2, CA3, and CA4 may be adjacent to one another, thereby implementing a continuous display area. Each of the first to fourth curved areas CA1, CA2, CA3, and CA4 may be bent from the planar area PA. Curvatures of the first to fourth curved areas CA1, CA2, CA3, and CA4 may be the same or different from one another.

Each of the first curved area CA1 and the second curved area CA2 may extend in the third direction D3 and may be spaced in the second direction D2 with the planar area PA interposed therebetween. Each of the third curved area CA3 and fourth curved area CA4 may extend in the second direction D2 and may be spaced in the third direction D3 with the planar area PA interposed therebetween.

FIG. 1A illustrates a display device 100 that includes one planar area PA and the four first to fourth curved areas CA1, CA2, CA3, and CA4, but the embodiments are not limited thereto.

For example, the display device 100 may include one planar area PA and only some of the first to fourth curved areas CA1, CA2, CA3, and CA4. For example, some of the curved areas CA1, CA2, CA3 or CA4 may be omitted.

Referring to FIG. 1B, the display device 100 may include a window WM, an adhesive layer AP, and a display panel DP.

The window WM may include an optically transparent insulating material, and the window WM may include glass or plastic. The window WM may have a multilayer structure or a single layer structure.

The window WM may include a planar area PA and the first to fourth curved areas CA1, CA2, CA3, and CA4 which extend from the planar area PA and are bent, respectively. Each of the first to fourth curved areas CA1, CA2, CA3, and CA4 may be bent from the planar area PA, respectively. The curvatures of the first to fourth curved areas CA1, CA2, CA3, and CA4 may be the same or different from one another.

The planar area PA may correspond to the planar area PA described in FIG. 1A. The curved areas CA1, CA2, CA3, and CA4 may correspond to the curved areas CA1, CA2, CA3, and CA4 described in FIG. 1A, respectively.

Each of the first curved area CA1 and the second curved area CA2 may extend in the third direction D3 and may be spaced in the second direction D2 with the planar area PA interposed therebetween. Each of the third curved area CA3 and the fourth curved area CA4 may extend in the second direction D2 and may be spaced in the third direction D3 with the planar area PA interposed therebetween.

The display panel DP may be disposed under the window WM. The display panel DP may be a component that substantially generates an image. The display panel DP may be a light emitting display panel. For example, the display panel DP may be a liquid crystal display panel, an electrophoretic display panel, a microelectromechanical system display panel, an electrowetting display panel, an organic light emitting display panel, or an inorganic light emitting display panel, and is not particularly limited thereto.

Although not shown in FIG. 1B, the window WM may further include a protection (or protective) member disposed under the display panel DP. The protection member may be disposed under the display panel DP to protect the display panel DP from external impact. The protective member may include multiple layers. For example, the protection member may include a light blocking layer, a heat dissipation layer, a cushion layer, and multiple adhesive layers.

The light blocking layer may prevent components disposed on the rear surface of the display panel DP from being visible. The light blocking layer may include a binder and a pigment particles dispersed therein. The pigment particles may include carbon black or the like.

The heat dissipation layer may effectively dissipate heat generated from the display panel DP. The heat dissipation layer may be provided as a metal plate having good heat dissipation properties. For example, the heat dissipation layer may include at least one of stainless steel, graphite, copper, and aluminum, but is not limited thereto. The heat dissipation layer may not only improve heat dissipation properties, but may also have electromagnetic wave shielding or electromagnetic wave absorption properties.

The cushion layer may be a synthetic resin foam. The cushion layer may include a matrix member and air gaps. The air gaps may be defined by being dispersed in the matrix member. The cushion layer according to an embodiment may be disposed under the heat dissipation layer. The cushion layer has elasticity and may have a porous structure.

The adhesive layer AP may be disposed on the display panel DP to attach the window WM and the display panel DP. The adhesive layer AP may be a transparent adhesive member such as a pressure sensitive adhesive (PSA) film, an optically clear adhesive (OCA) film, or an optically clear adhesive (OCR) resin.

Although not shown in FIG. 1B, the adhesive layer AP and the display panel DP disposed under the window WM may include portions bent to correspond to a shape of the window WM. For example, the adhesive layer AP and the display panel DP may be bent to correspond to shapes of the first to fourth curved areas CA1, CA2, CA3, and CA4 of the window WM.

Figure 2A:
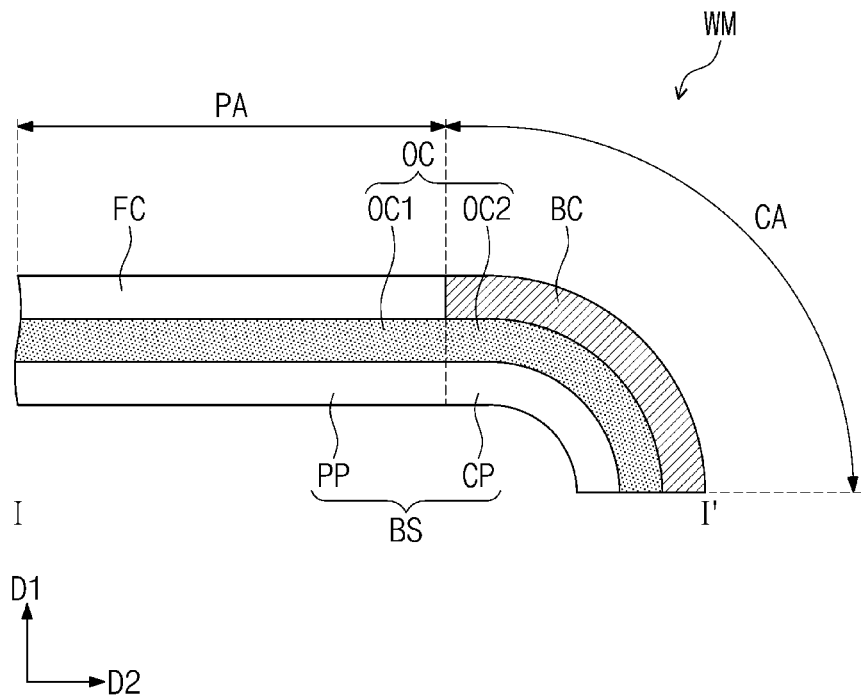
FIG. 2A is a schematic cross-sectional view of a window according to an embodiment of the disclosure.
Figure 2B:
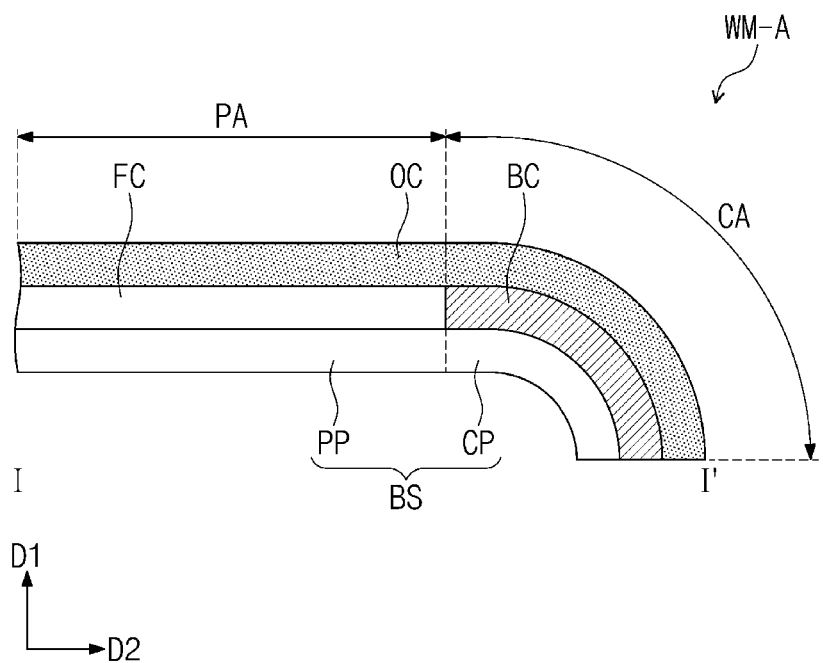
FIG. 2B is a schematic cross-sectional view of a window according to an embodiment of the disclosure.

FIG. 2A is a schematic cross-sectional view of the window WM according to an embodiment of the disclosure. FIG. 2B is a schematic cross-sectional view of the window WM according to an embodiment of the disclosure. FIGS. 2A and 2B are cross-sectional views taken along line I-I' shown in FIG. 1B.

Referring to FIG. 2A, in an embodiment, the window WM may include a base substrate BS, a front cover layer OC, a flat cover layer FC, and a bending cover layer BC.

The base substrate BS may include a planar portion PP and a curved portion CP extending from the planar portion PP in the second direction D2. The curved portion CP may be bent. The planar portion PP of the base substrate BS may define the planar area PA of the window WM. The curved portion CP of the base substrate BS may define the curved area CA of the window WM.

The curved area CA may correspond to one of the first to fourth curved areas CA1, CA2, CA3, and CA4 described in FIG. 1B. FIG. 2A illustrates that the curved area CA corresponds to the first curved area CA1 of FIG. 1B as an example, but may also correspond to one of the second to fourth curved areas CA2, CA3, and CA4.

The base substrate BS may be provided as a glass or a plastic substrate. When the base substrate BS is a plastic substrate, the base substrate may include a polymer material. For example, the base substrate may be formed of polyimide (PI), polyacrylate (PA), polymethylmethacrylate (PMMA), polycarbonate (PC), polyethylenenaphthalate (PEN), polyvinylidene chloride (PVC), polyvinylidene difluoride (PVDF), polystyrene (PS), ethylene vinyl alcohol copolymer, or a combination thereof.

The base substrate BS is not limited to the polymer material described above. The base substrate BS may be used without limitation as long as it is a material having optical transparency to display an image provided by the display panel DP (refer to FIG. 1B) of the display device 100 (refer to FIG. 1B) to a user.

The front cover layer OC may be disposed on the planar portion PP and the curved portion CP of the base substrate BS. The front cover layer OC may include a first front cover layer OC1 overlapping the planar area PA and a second front cover layer OC2 overlapping the curved area CA.

The front cover layer OC may include a hard material. In an embodiment, the front cover layer OC may include an inorganic material. For example, the front cover layer OC may include one of silicon nitride (SiNx), silicon oxide (SiOx), and aluminum oxide ($Al_2O_3$).

The flat cover layer FC may be disposed on the first front cover layer OC1. The flat cover layer FC may overlap the planar area PA and may not overlap the curved area CA.

According to the embodiment, layers having different refractive indices may be alternately disposed in the flat cover layer FC. The flat cover layer FC prevents reflection of light entering a front surface of the display panel DP, thereby increasing the visibility of the display device 100. A detailed description of this will be described below.

The bending cover layer BC may be disposed on the second front cover layer OC2. The bending cover layer BC may overlap the curved area CA and may not overlap the planar area PA.

The bending cover layer BC may include a hard material. In an embodiment, the bending cover layer BC may include an inorganic material. For example, the bending cover layer BC may include one of silicon nitride (SiNx), silicon oxide (SiOx), and aluminum oxide ($Al_2O_3$).

The planar portion PP of the base substrate BS may have a first hardness due to the first front cover layer OC1. The curved portion CP of the base substrate BS may have a second hardness higher than the first hardness due to the second front cover layer OC2 and the bending cover layer BC. As the hardness of the curved portion CP is determined by two cover layers, unlike the planar portion PP, the curved portion CP may have a higher hardness than the planar portion PP.

As the curved portion CP has a curvature, unlike the planar portion PP, a crack may easily occur due to an impact occurring near an edge of the base substrate BS. In the disclosure, the hardness of the curved portion CP may be increased by the two cover layers disposed on the curved portion CP, thereby preventing cracks caused by impacts that may occur near the edge. Accordingly, the disclosure may provide the window WM with improved durability.

In an embodiment, the sum of the hardness of the front cover layer OC and the hardness of the bending cover layer BC may be about 8 GPa or more. When the sum of the hardness of the front cover layer OC and the hardness of the bending cover layer BC is less than about 8 GPa, it may not be sufficient to prevent the base substrate BS from being damaged by an external impact.

For example, the front cover layer OC may have a hardness of about 10 GPa, the bending cover layer BC may have a hardness of about 2 GPa. Accordingly, as the front cover layer OC and the bending cover layer BC have a total hardness of about 12 GPa on the base substrate, it is possible to prevent the base substrate BS from being damaged by external impact. As a hardness of about 2 GPa is added to the curved portion CP than that of the planar portion PP, durability near the edge where cracks easily occur may be improved.

In an embodiment, each of the front cover layer OC and the bending cover layer BC may have a thickness in a range of about 500 nm or more and about 5000 nm or less. When the thickness of each of the front cover layer OC and the bending cover layer BC is less than about 500 nm, it may have insufficient hardness to prevent damage to the base substrate BS. When each of the thickness of the front cover layer OC and the thickness of the bending cover layer BC is more than about 5000 nm, as the thickness of the window WM increases, the thickness of the window may interfere with light generated from the display panel DP being emitted to the outside.

FIG. 2A illustrates that the cover layer including the hard material is disposed on the curved portion CP in two layers, but is not limited thereto, and the cover layer may be disposed in two or more layers.

Referring to FIG. 2B, in an embodiment, a window WM-A may include the base substrate BS, the flat cover layer FC, the bending cover layer BC, and the front cover layer OC. The same/similar reference numerals are used for the same/similar elements as those described in FIG. 2A, and repetitive descriptions are omitted.

The flat cover layer FC may be disposed on the planar portion PP of the base substrate BS. The flat cover layer FC may overlap the planar area PA and may not overlap the curved area CA.

According to the embodiment, layers having different refractive indices may be alternately disposed in the flat cover layer FC. The flat cover layer FC may prevent reflection of light entering the front surface of the display panel DP (refer to FIG. 2A), thereby increasing the visibility of the display device 100 (refer to FIG. 1B). A detailed description of this will be described below.

The bending cover layer BC may be disposed on the curved portion CP of the base substrate BS. The bending cover layer BC may overlap the curved area CA and may not overlap the planar area PA. The front cover layer OC may be disposed on the flat cover layer FC and the bending cover layer BC.

In an embodiment, the bending cover layer BC and the front cover layer OC may include a hard material. The bending cover layer BC and the front cover layer OC may include an inorganic material. For example, each of the bending cover layer BC and the front cover layer OC may include one of silicon nitride (SiNx), silicon oxide (SiOx), and aluminum oxide ($Al_2O_3$).

When including a curved surface near the edge of the window WM-A, the base substrate BS may be easily cracked by the impact generated near the edge. In the disclosure, as the cover layer including the hard material is disposed on the curved portion CP in two layers, the hardness of the curved portion CP may be increased. Accordingly, it is possible to prevent the cracks due to impacts occurring near the edge, and improve the durability of the window WM-A.

FIG. 2B illustrates that the cover layer including the hard material being disposed on the curved portion CP in two layers, but the embodiments are not limited thereto, and the cover layer may be disposed in two or more layers.

Figure 3:
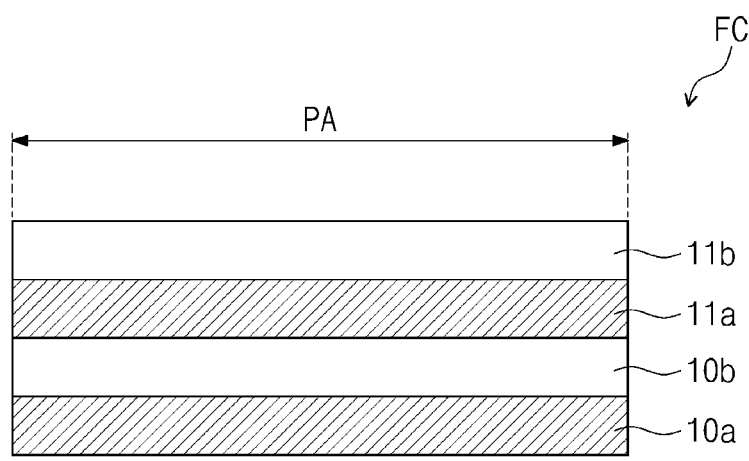
FIG. 3 is a schematic cross-sectional view of a partial configuration of a window according to an embodiment of the disclosure.

FIG. 3 is a schematic cross-sectional view of a partial configuration of the window WM according to an embodiment of the disclosure. FIG. 3 is a cross-sectional view illustrating a configuration of the flat cover layer FC according to an embodiment.

Referring to FIG. 3, the flat cover layer FC may include multiple layers. According to an embodiment, a 1-1st layer 10a, a 1-2nd layer 10b, a 2-1st layer 11a, and a 2-2nd layer 11b may be sequentially disposed.

A. The 1-1st layer 10a and the 2-1st layer 11a may include a material having a high refractive index. In an embodiment, the material for the 1-1st layer 10a and the 2-1st layer 11a may include one of silicon nitride (SiNx), silicon oxynitride (SiOxNy), aluminum oxynitride (AlON), and aluminum oxide (AlxOy). The refractive indices of the 1-1st layer 10a and the 2-1st layer 11a may be about 1.85 or higher.

B. The 1-2nd layer 10b and the 2-2nd layer 11b may include a material having a low refractive index. The 1-2nd layer 10b and the 2-2nd layer 11b may include one of silicon dioxide ($SiO_2$), silicon oxide (SiO), and magnesium oxide (MgO). The refractive indices of the 1-2nd layer 10b and the 2-2nd layer 11b may be about 1.75 or less.

Each of the 1-1st layer 10a and the 2-1st layer 11a may have the refractive index higher than that of the 1-2nd layer 10b and the 2-2nd layer 11b. However, the disclosure is not limited thereto, and the 1-1st layer 10a and the 2-1st layer 11a may include a material having a low refractive index, and the 1-2nd layer 10b and the 2-2nd layer 11b may include a material having a high refractive index.

It is illustrated that layers including a material that has a high refractive index and layers including a material that has a low refractive index are alternately disposed twice. However, the disclosure is not limited thereto, and may have a layer structure that alternates once, or may have a layer structure that alternates more than twice.

When viewed in cross section, a thickness of the flat cover layer FC may be about 500 nm or more and about 5000 nm or less. According to the embodiment, the flat cover layer FC may have the same width as the bending cover layer BC. Accordingly, a step may not be formed on an upper surface of the window WM.

In other embodiments, the thicknesses of the flat cover layer FC and the thicknesses of the bending cover layer BC may be different. Accordingly, a step may be formed between the flat cover layer FC and the bending cover layer BC. This is because the optimum thickness of the flat cover layer FC, for applying an anti-reflection function, and the optimum thickness of the bending cover layer BC, for imparting hardness, are different.

Figure 4A:
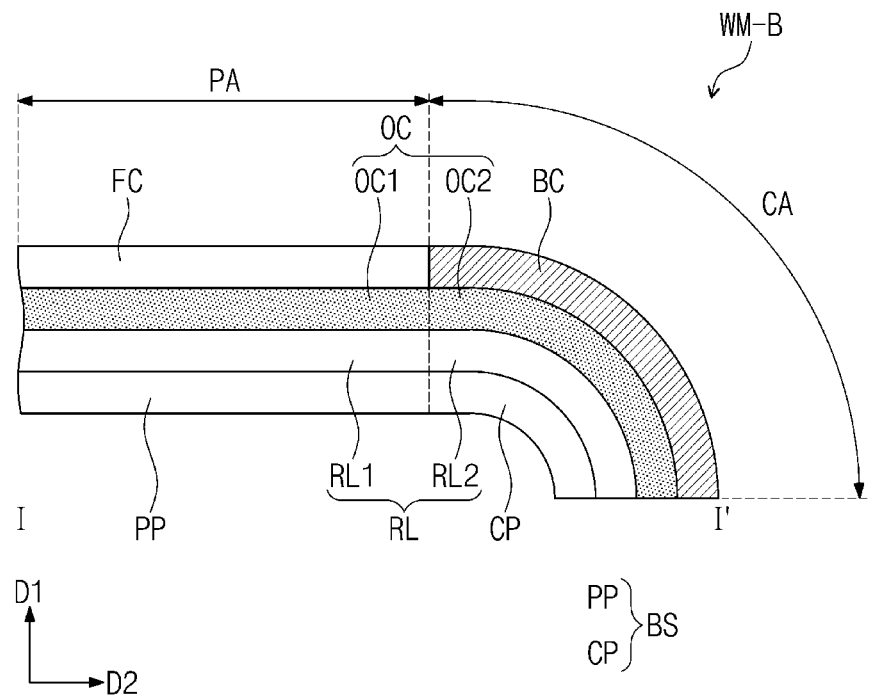
FIG. 4A is a schematic cross-sectional view of a window according to an embodiment of the disclosure.
Figure 4B:
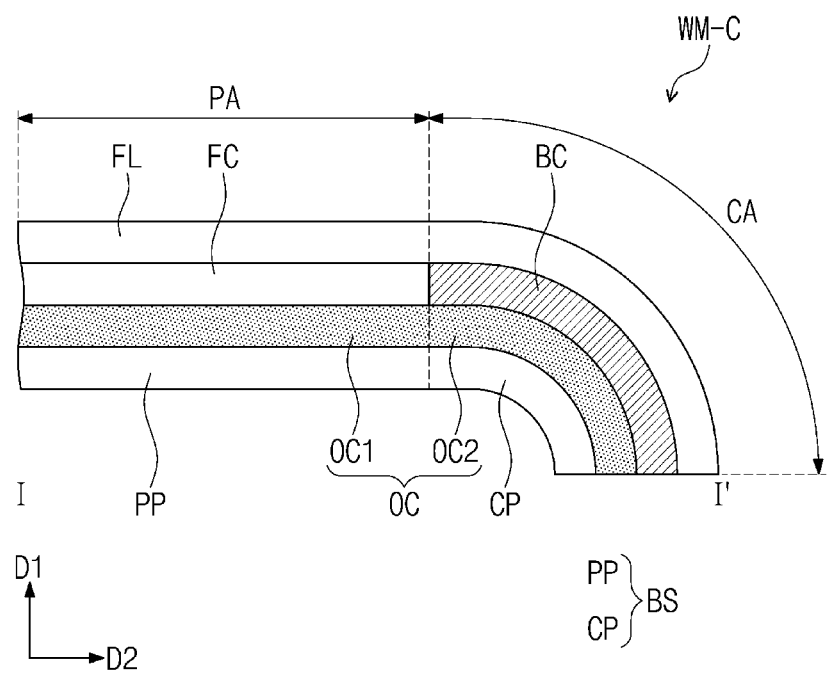
FIG. 4B is a schematic cross-sectional view of a window according to an embodiment of the disclosure.
Figure 5A:
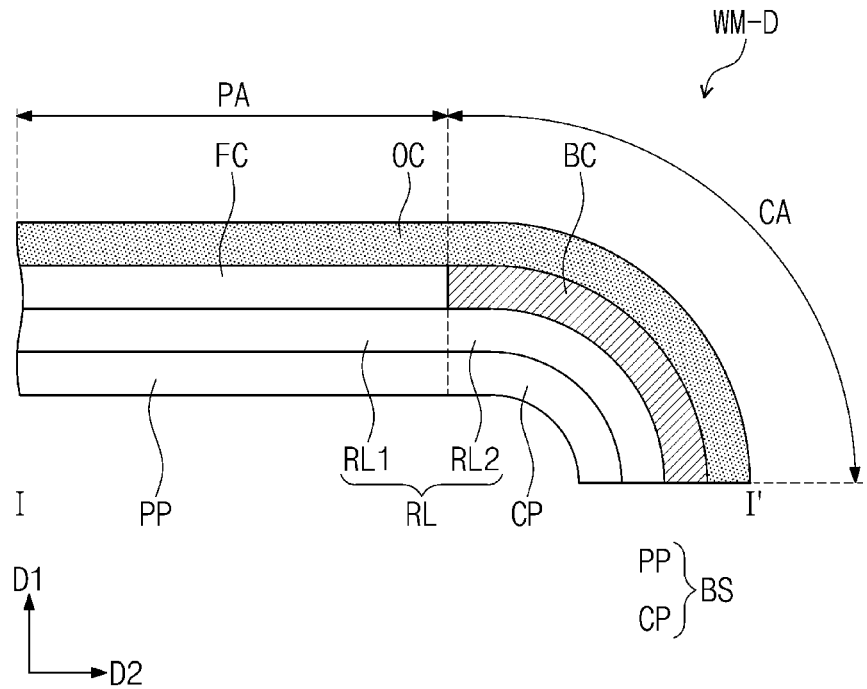
FIG. 5A is a schematic cross-sectional view of a window according to an embodiment of the disclosure.
Figure 5B:
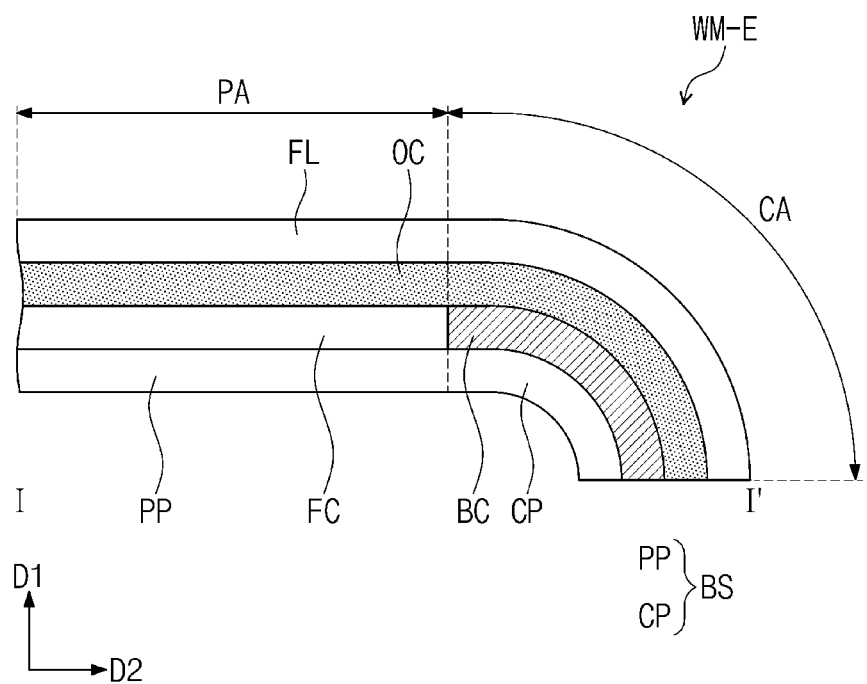
FIG. 5B is a schematic cross-sectional view of a window according to an embodiment of the disclosure.

FIG. 4A is a schematic cross-sectional view of a window WM-B according to an embodiment of the disclosure. FIG. 4B is a schematic cross-sectional view of a window WM-C according to an embodiment of the disclosure. FIG. 5A is a schematic cross-sectional view of a window WM-D according to an embodiment of the disclosure. FIG. 5B is a schematic cross-sectional view of a window WM-E according to an embodiment of the disclosure. FIGS. 4A to 5B are cross-sectional views taken along line I-I' shown in FIG. 1B. The same/similar reference numerals are used for the same/similar configurations as those described in FIGS. 1A to 3, and repetitive descriptions are omitted.

Referring to FIG. 4A, the window WM-B may include a base substrate BS, a front cover layer OC, a flat cover layer FC, and a bending cover layer BC. In the embodiment, the window WM-B may further include an anti-reflection layer RL.

The anti-reflection layer RL may be disposed on the planar portion PP and the curved portion CP of the base substrate BS. The anti-reflection layer RL may have the same/similar configuration as the flat cover layer FC described in FIG. 3.

The anti-reflection layer RL may include a first anti-reflection layer RL1 overlapping the planar area PA and a second anti-reflection layer RL2 overlapping the curved area CA. According to the embodiment, the first anti-reflection layer RL1 reduce reflections in the planar area PA, and the second anti-reflection layer RL2 may reduce reflections in the curved area CA.

The front cover layer OC may be disposed on the first anti-reflection layer RL1 and the second anti-reflection layer RL2. The front cover layer OC may include the first front cover layer OC1 overlapping the planar area PA and the second front cover layer OC2 overlapping the curved area CA.

The flat cover layer FC may overlap the planar area PA and may be disposed on the first front cover layer OC1. The bending cover layer BC may overlap the curved area CA and may be disposed on the second front cover layer OC2.

In the disclosure, the front cover layer OC and the bending cover layer BC may include a hard material. The front cover layer OC and the bending cover layer BC may include an inorganic material.

According to the embodiment, the window WM-B may have a cover layer made of a hard material on the curved portion CP in two layers. Accordingly, the curved portion CP may have greater hardness, and cracks in the base substrate BS due to side impacts (impacts generated from the side) may be prevented.

Referring to FIG. 4B, the window WM-C may include a front cover layer OC, a flat cover layer FC, and a bending cover layer BC. According to the embodiment, the window WM-C may further include a functional layer FL.

The front cover layer OC may be disposed on the planar portion PP and the curved portion CP of the base substrate BS. The front cover layer OC may include the first front cover layer OC1 overlapping the planar area PA and the second front cover layer OC2 overlapping the curved area CA.

The flat cover layer FC may overlap the planar area PA and may be disposed on the first front cover layer OC1. The bending cover layer BC may overlap the curved area CA and may be disposed on the second front cover layer OC2.

The functional layer FL may be disposed on the flat cover layer FC and the bending cover layer BC. The functional layer FL may include at least one of an anti-fingerprint layer and an anti-static layer.

The anti-fingerprint layer may be formed by coating a solution containing an anti-fingerprint material. The anti-fingerprint material may be formed of at least one of a metal oxide such as titanium oxide, a silicon-based compound, and a fluorine-based compound, but the anti-fingerprint material in the embodiments is not limited thereto. The coating method may be a wet coating method or a dry coating method, but is not limited thereto.

The anti-static layer may include a material that removes static electricity. The anti-static material may include at least one of a metallic compound and an ionic liquid material. The metallic compound may include antimony pentoxide ($Sb_2O_5$) or tin dioxide ($SnO_2$). The ionic liquid material may include ammonium ($NH^{4+}$), phosphonium ($PH^{4+}$), imidazolluim, pyridinium, or lithium ion ($Li^+$).

Referring to FIG. 5A, the window WM-D may include a base substrate BS, a flat cover layer FC, a bending cover layer BC, and a front cover layer OC. In the embodiment, the window WM-D may further include an anti-reflection layer RL.

The anti-reflection layer RL may be disposed on the planar portion PP and the curved portion CP of the base substrate BS. The anti-reflection layer RL may have the same/similar configuration as the flat cover layer FC described in FIG. 3.

The anti-reflection layer RL may include the first anti-reflection layer RL1 overlapping the planar area PA and the second anti-reflection layer RL2 overlapping the curved area CA. According to the embodiment, the first anti-reflection layer RL1 may reduce reflections in the planar area PA, and the second anti-reflection layer RL2 may reduce reflection in the curved area CA.

The flat cover layer FC may overlap the planar area PA and may be disposed on the first anti-reflection layer RL1. The bending cover layer BC may overlap the curved area CA and may be disposed on the second anti-reflection layer RL2. The front cover layer OC may be disposed on the flat cover layer FC and the bending cover layer BC.

In an embodiment, the bending cover layer BC and the front cover layer OC may each include a hard material. The bending cover layer BC and the front cover layer OC may include an inorganic material. According to the embodiment, the cover layer made of the hard material may be disposed on the curved portion CP in two layers. Accordingly, the hardness of the curved portion CP may be increased, and the cracks in the base substrate BS due to side impacts (impacts generated from the side) may be prevented.

Referring to FIG. 5B, the window WM-E may include a flat cover layer FC, a bending cover layer BC, and a front cover layer OC. According to the embodiment, the window WM-E may further include a functional layer FL.

The flat cover layer FC may be disposed on the planar portion PP of the base substrate BS. The bending cover layer BC may be disposed on the curved portion CP of the base substrate BS. The front cover layer OC may be disposed on the flat cover layer FC and the bending cover layer BC.

The functional layer FL may be disposed on the front cover layer OC. The functional layer FL may include at least one of an anti-fingerprint layer and an antistatic layer. Materials of the anti-fingerprint layer and the antistatic layer are the same as (or substantially similar to) those of the functional layer FL described in FIG. 4B.

Figure 6A:
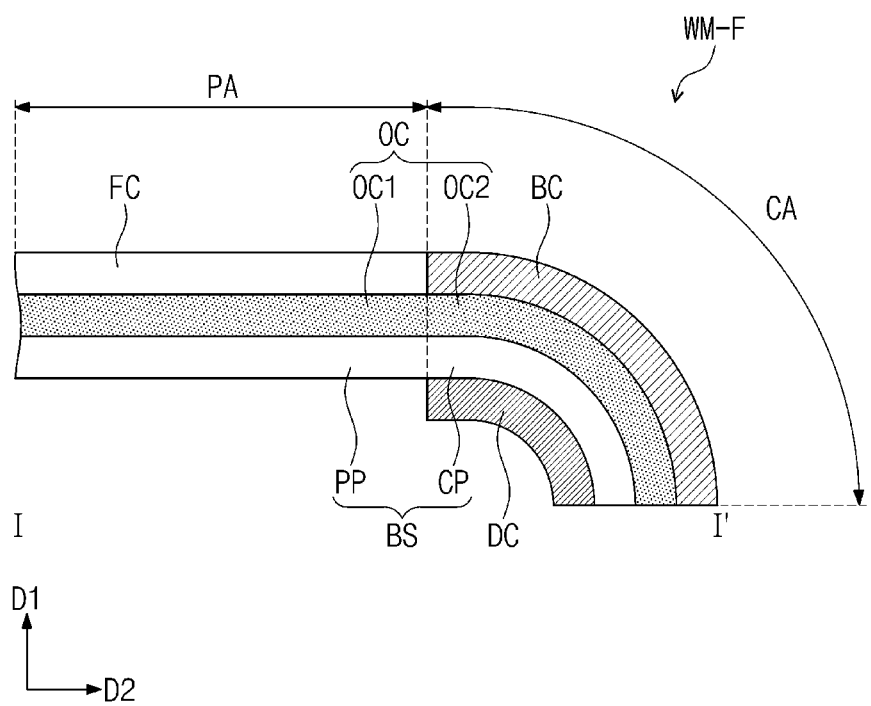
FIG. 6A is a schematic cross-sectional view of a window according to an embodiment of the disclosure.
Figure 6B:
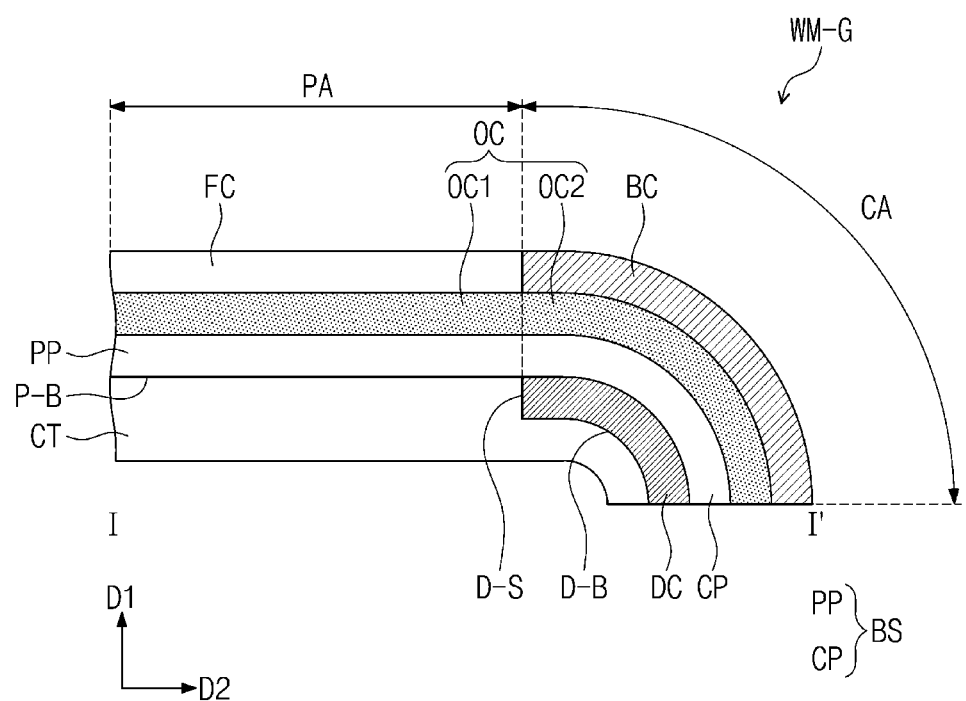
FIG. 6B is a schematic cross-sectional view of a window according to an embodiment of the disclosure.

FIG. 6A is a schematic cross-sectional view of a window WM-F according to an embodiment of the disclosure. FIG. 6B is a schematic cross-sectional view of a window WM-G according to an embodiment of the disclosure. FIGS. 6A and 6B are cross-sectional views taken along line I-I' shown in FIG. 1B. The same/similar reference numerals are used for the same/similar configurations as in FIGS. 1A to 5B, and repetitive descriptions are omitted.

Referring to FIG. 6A, the window WM-F may include a base substrate BS, a front cover layer OC, a flat cover layer FC, and a bending cover layer BC. According to the embodiment, the window WM-F may further include a lower cover layer DC.

The front cover layer OC may be disposed on the planar portion PP and the curved portion CP of the base substrate BS. The flat cover layer FC may overlap the planar area PA and may be disposed on the first front cover layer OC1. The bending cover layer BC may overlap the curved area CA and may be disposed on the second front cover layer OC2.

According to the embodiment, the lower cover layer DC may be disposed under the base substrate BS to overlap the curved area CA. The lower cover layer DC may include a hard material. In an embodiment, the lower cover layer DC may include an inorganic material. For example, the lower cover layer DC may include one of silicon nitride (SiNx), silicon oxide (SiOx), and aluminum oxide ($Al_2O_3$).

According to the disclosure, as the cover layer including a hard material is disposed on the curved portion CP of the base substrate BS in two layers, compressive stress applied to a lower part of the curved portion CP may increase. Because of the increased compressive stress, the layers of the window may separate at the edge of the curved portion CP.

In an embodiment, as the lower cover layer DC including a hard material may be disposed under the curved portion CP, and may compensate for the compressive stress applied to the lower part of the curved portion CP. Accordingly, the lower cover layer DC may prevent the edge of the curved portion CP from being apart.

The lower cover layer DC may have a thickness of about 500 nm or more and about 5000 nm or less. When the thickness of the lower cover layer DC is less than about 500 nm, it may have insufficient hardness to compensate for the compressive stress applied to the lower part of the curved portion CP. When the thickness of the lower cover layer DC exceeds about 5000 nm, as the thickness of the window WM-F increases, the thickness of the window may interfere with light generated from the display panel DP (refer to FIG. 1B) being emitted to the outside.

FIG. 6A illustrates the lower cover layer DC, including hard material, as a single layer under the curved portion CP, but the embodiments are not limited thereto, and the lower cover layer DC may include multiple layers.

Referring to FIG. 6B, the window WM-G may include a base substrate BS, a front cover layer OC, a flat cover layer FC, and a bending cover layer BC. According to the embodiment, the window WM-G may further include the lower cover layer DC and a coating layer CT. The window WM-G shown in FIG. 6B further includes the coating layer CT on the window WM-F shown in FIG. 6A.

The coating layer CT may be disposed under the planar portion PP and the lower cover layer DC of the base substrate BS. The coating layer CT may cover a lower surface P-B of the planar portion PP of the base substrate BS, a lower surface D-B of the lower cover layer DC, and a side surface D-S of the lower cover layer DC that is adjacent to the planar portion PP.

According to the embodiment, a step may be formed by the side surface D-S of the lower cover layer DC that is adjacent to the planar portion PP. The coating layer CT removes the step by covering the side surface D-S of the lower cover layer that is adjacent to the planar portion PP. Accordingly, the coating layer CT may facilitate attaching other layers (that are disposed under the window WM-G) to the window WM-G.

The embodiments of FIGS. 6A and 6B may also be applied to the window WM-A described in FIG. 2B. The window WM-A may further include the lower cover layer DC disposed under the base substrate BS to overlap the curved area CA. In the curved area CA of the window WM-A, the lower cover layer DC, the base substrate BS, the bending cover layer BC, and the front cover layer OC may be sequentially disposed. The coating layer CT may be further included under the planar portion PP and the lower cover layer DC of the base substrate BS.

Figure 7A:
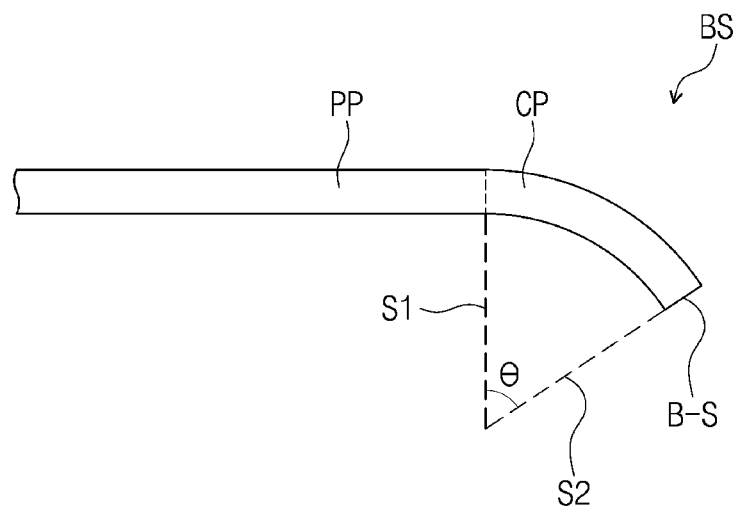
FIG. 7A is a schematic cross-sectional view of a partial configuration of a window according to an embodiment of the disclosure.
Figure 7B:
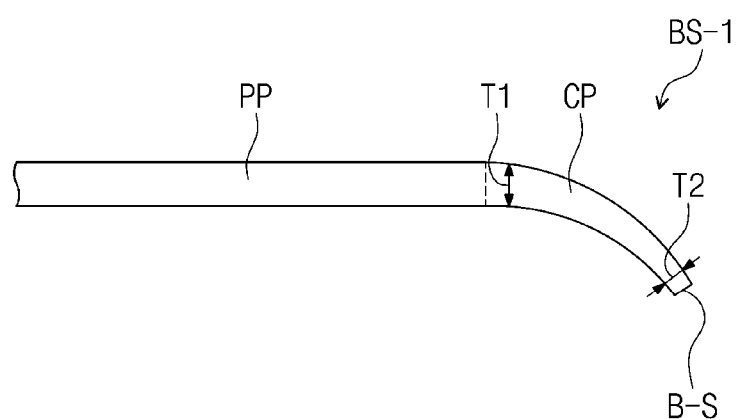
FIG. 7B is a schematic cross-sectional view of a partial configuration of a window according to an embodiment of the disclosure.

FIG. 7A is a schematic cross-sectional view of a partial configuration of the window WM according to an embodiment of the disclosure. FIG. 7B is a schematic cross-sectional view of a partial configuration of the window WM according to an embodiment of the disclosure. FIGS. 7A and 7B are cross-sectional views illustrating the base substrate BS according to an embodiment.

Referring to FIG. 7A, an end of the curved portion CP of the base substrate BS may be defined as a boundary surface (hereinafter, referred to as a boundary surface) between the planar portion PP and the curved portion CP. In FIG. 7A, the boundary surface is shown by a dotted line. Another end of the curved portion CP may be defined as a side surface B-S facing the boundary surface.

The base substrate BS may define a virtual first extension surface S1 extending the boundary surface. The base substrate BS may define a virtual second extension surface S2 extending the side surface B-S.

According to the embodiment, an angle q formed by the first extension surface S1 and the second extension surface S2 may be about 90 degrees or less. When the angle q exceeds about 90 degrees, a part of lower surfaces of the base substrate BS may face each other. Accordingly, when the angle q exceeds about 90 degrees, it may be difficult to form the cover layer covering the entire surface of the planar portion PP and the curved portion CP on the base substrate BS.

Referring to FIG. 7B, an end of the curved portion CP of a base substrate BS-1 may be defined as a boundary surface (hereinafter, referred to as a boundary surface) between the planar portion PP and the curved portion CP. In this drawing, the boundary surface is shown by a dotted line. The other end of the curved portion CP may be defined as a side surface B-S facing the boundary surface.

The curved portion CP of the base substrate BS-1 according to an embodiment may have a thickness that varies as a distance from the planar portion PP varies in cross section.

A thickness of the curved portion CP adjacent to the boundary surface may be defined as a first thickness T1. The thickness of the curved portion CP adjacent to the side surface B-S may be defined as a second thickness T2. According to an embodiment, the first thickness T1 may be greater than the second thickness T2. However, the disclosure is not limited thereto, and the first thickness T1 may be smaller than the second thickness T2.

Figure 8:
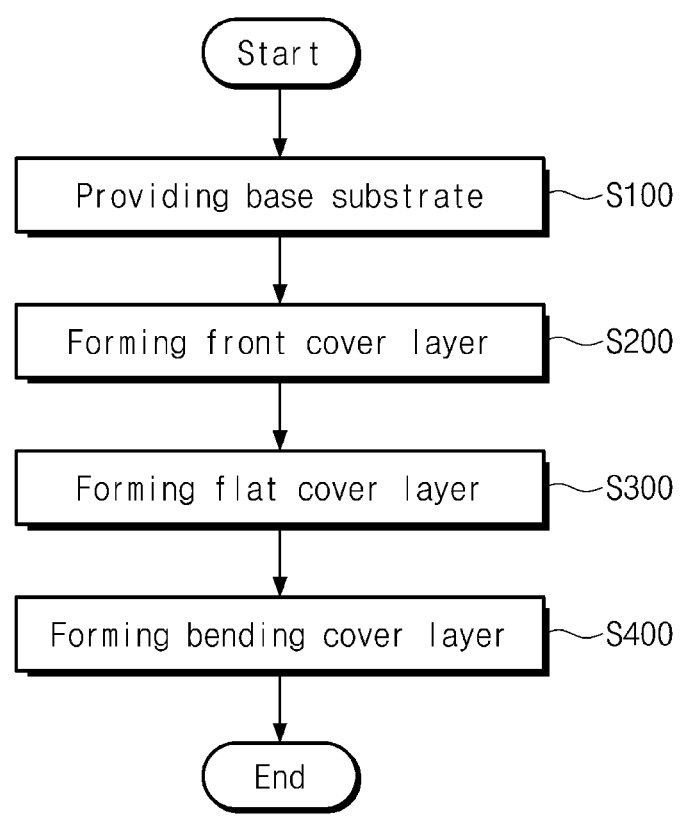
FIG. 8 is a flow chart illustrating a method of manufacturing a window according to an embodiment of the disclosure.

FIG. 8 is a flow chart illustrating a method of manufacturing a window according to an embodiment of the disclosure. FIGS. 9A to 9E are cross-sectional views illustrating a method of manufacturing the window WM according to an embodiment of the disclosure. The same/similar reference numerals are used for the same/similar configurations as in FIGS. 1A to 8, and repetitive descriptions are omitted.

Referring to FIG. 8, a method of manufacturing a window according to an embodiment includes: providing a base substrate in S100, forming a front cover layer in S200, forming a flat cover layer in S300, and forming a bending cover layer in S400. Hereinafter, detailed descriptions of each operation will be made with reference to FIGS. 9A to 9E.

Figure 9A:
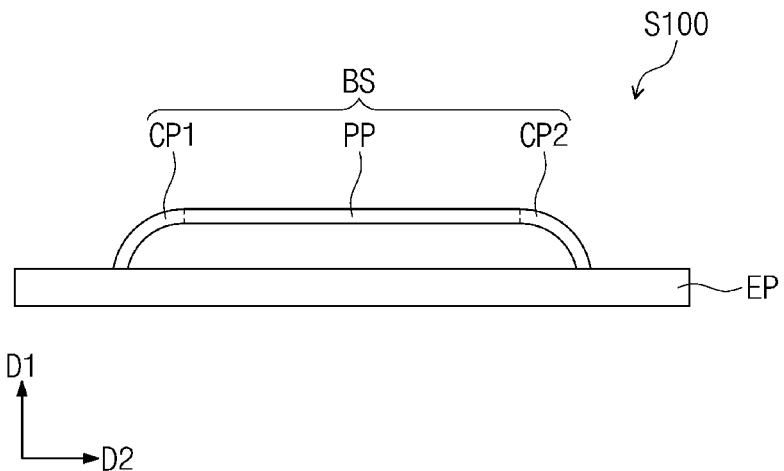
FIGS. 9A to 9E are schematic cross-sectional views illustrating a method of manufacturing a window according to an embodiment of the disclosure.

Referring to FIG. 9A, the method of manufacturing the window may include providing the base substrate BS on a deposition substrate EP. The base substrate BS may include the planar portion PP extending in the second direction D2 and the curved portions CP1 and CP2 which are bent.

The curved portions CP1 and CP2 may surround at least a part of the planar portion PP. According to the embodiment, the curved portions CP1 and CP2 may include the first curved portion CP1 extending from one end of the planar portion PP and the second curved portion CP2 extending from the other end of the planar portion PP. However, the disclosure is not limited thereto, and the curved portion may extend to only one end of the planar portion PP.

Figure 9B:
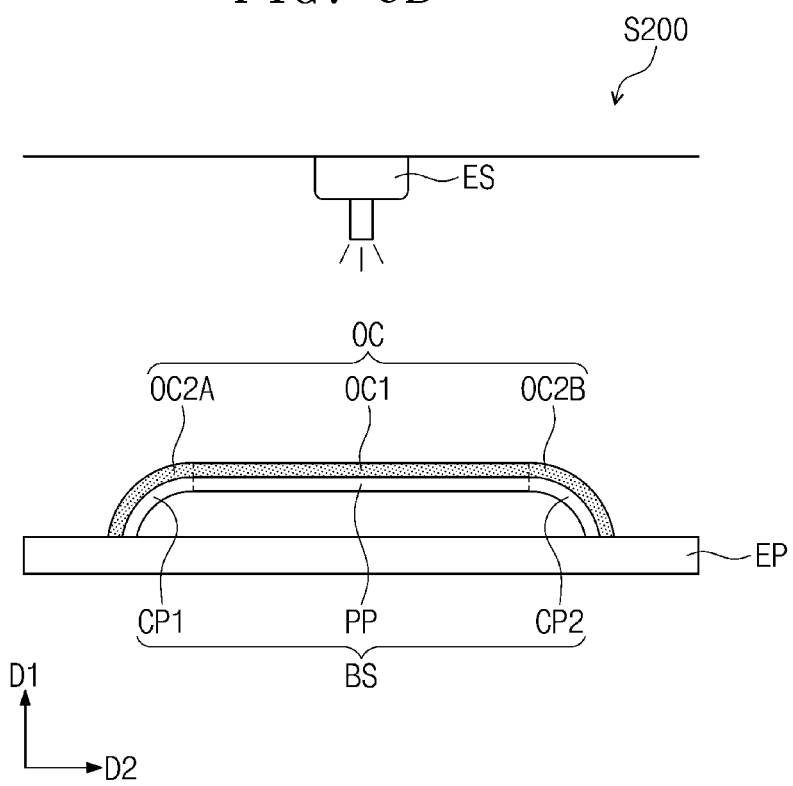

Referring to FIG. 9B, the method of manufacturing the window may include forming the front cover layer OC on the planar portion PP, the first curved portion CP1, and the second curved portion CP2 of the base substrate BS.

The front cover layer OC may be provided by a deposition process using a deposition source ES. For example, the front cover layer OC may be provided by sputtering or e-beam evaporation.

The front cover layer OC may include the first front cover layer OC1 disposed on the planar portion PP, a 2-1st front cover layer OC2A disposed on the first curved portion CP1, and a 2-2nd front cover layer OC2B disposed on the second curved portion CP2.

In an embodiment, the front cover layer OC may include a hard material. The front cover layer OC may include an inorganic material. Accordingly, the front cover layer OC may prevent damage to the base substrate BS from the external impact.

Figure 9C:
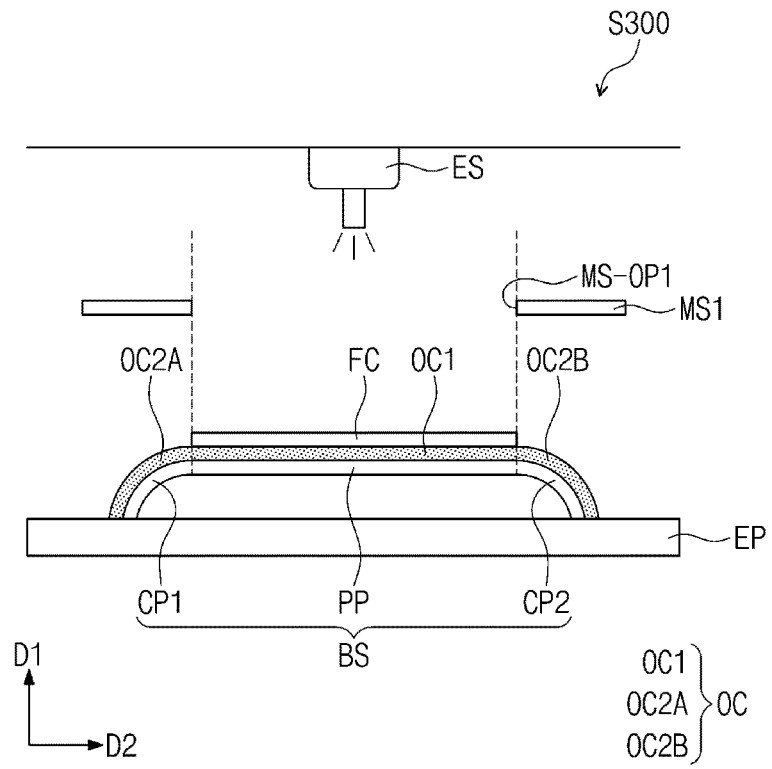

Thereafter, referring to FIG. 9C, the method of manufacturing the window may include forming the flat cover layer FC on the front cover layer OC.

The flat cover layer FC may be provided by a deposition process using the deposition source ES. For example, the flat cover layer FC may be provided by sputtering or e-beam evaporation.

In the depositing of the flat cover layer FC, a first mask MS1 including a first opening MS-OP1 may be used. The first opening MS-OP1 may overlap the planar portion PP of the base substrate BS. Accordingly, the flat cover layer FC may be disposed on the first front cover layer OC to overlap the planar portion PP.

In the flat cover layer FC, as described in FIG. 3, the layers having different refractive indices may be alternately disposed. Accordingly, reflectance of external light entering the display device 100 (refer to FIGS. 1A and 1B) may be reduced, and visibility of the display device may be increased.

Figure 9D:
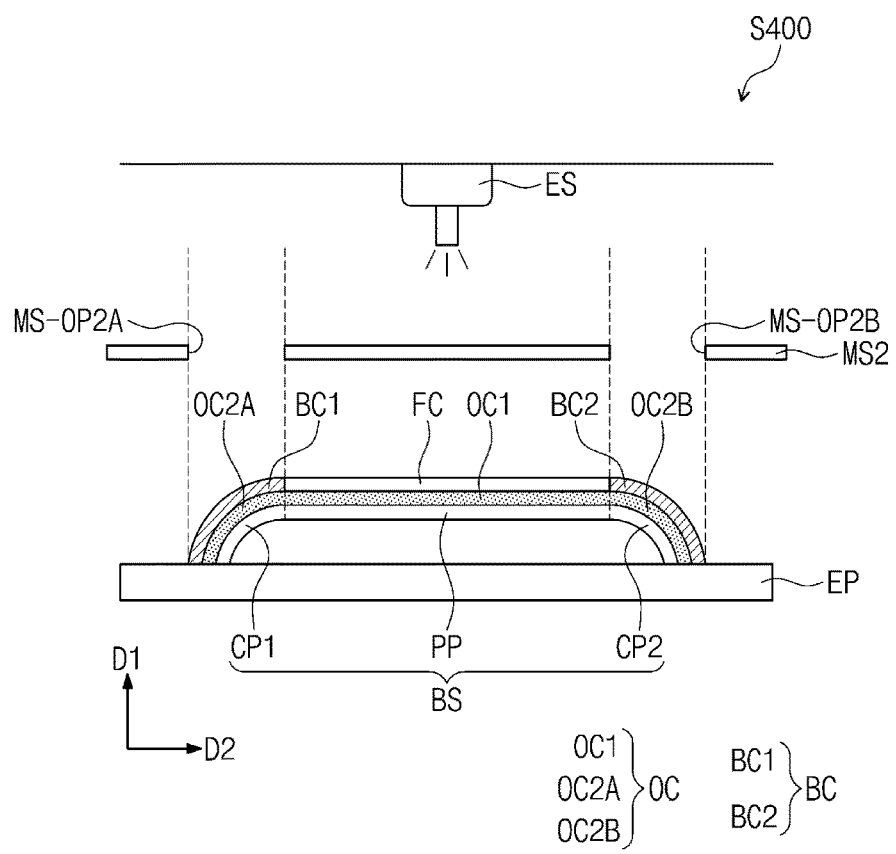

Thereafter, referring to FIG. 9D, the method of manufacturing the window may include forming the bending cover layer BC on the front cover layer OC.

The bending cover layer BC may be provided by a deposition process using the deposition source ES. For example, the bending cover layer BC may be provided by sputtering or e-beam evaporation.

In the depositing of the bending cover layer BC, a second mask MS2 including a 2-1st opening MS-OP2A and a 2-2nd opening MS-OP2B may be used. The 2-1st opening MS-OP2A may overlap at least a part of the first curved portion CP1. The 2-2nd opening MS-OP2B may overlap at least a part of the second curved portion CP2.

A first bending cover layer BC1 may be disposed on the 2-1st front cover layer OC2A by the 2-1st opening MS-OP2A. A second bending cover layer BC2 may be disposed on the 2-2nd front cover layer OC2B by the 2-2nd opening MS-OP2B.

Accordingly, the bending cover layer BC may include the first bending cover layer BC1 overlapping the first curved portion CP1 and the second bending cover layer BC2 overlapping the second curved portion CP2.

In an embodiment, the bending cover layer BC may include a hard material. The bending cover layer BC may include an inorganic material. Accordingly, the bending cover layer BC may prevent the damage to the base substrate BS from the impact on the side surface.

Figure 9E:
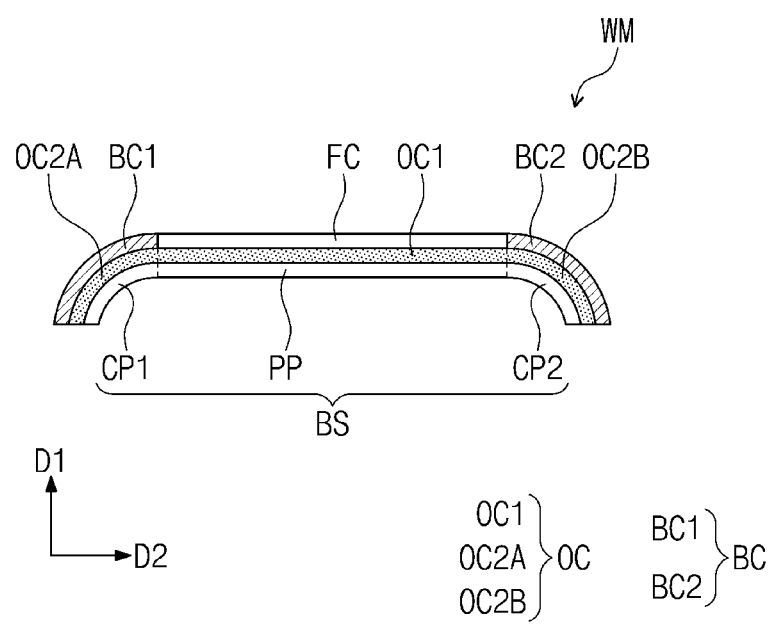

Referring to FIG. 9E, the window WM in which the front cover layer OC, the flat cover layer FC, and the bending cover layer BC are disposed on the base substrate BS may be provided through the manufacturing process of an embodiment.

The 2-1st front cover layer OC2A including an inorganic material and the first bending cover layer BC1 may be disposed on the first curved portion CP1. The 2-2nd front cover layer OC2B including an inorganic material and the second bending cover layer BC2 may be disposed on the second curved portion CP2. The inorganic material may include a hard material.

In an embodiment, the cover layer including the hard material may be disposed on the curved portions CP1 and CP2 in two layers, thereby increasing the hardness of the curved portions CP1 and CP2. Accordingly, the cracks due to impacts occurring on the side may be prevented, thereby manufacturing the window WM having improved durability.

The window according to the disclosure may have different arrangements of the cover layers on the planar portion and the curved portion of the base substrate. The hard cover layer on the curved portion may be further provided, and thus the hardness of the curved portion may be increased. Accordingly, the damage due to the side impacts on the window may be prevented, and the window with improved durability and reliability may be provided.

While the disclosure has been described with reference to embodiments thereof, it will be apparent to those of ordinary skill in the art that various changes and modifications may be made thereto without departing from the spirit and scope of the disclosure as set forth in the following claims.

Therefore, the disclosed subject matter should not be limited to any single embodiment described herein, and the scope of the disclosure shall be determined according to the attached claims.

What is claimed is:

1. A window comprising:
a base substrate including:
a planar portion substantially parallel to a plane defined by a first direction and a second direction intersecting the first direction; and
a curved portion extending from the planar portion in at least one of the first and second directions in a plan view and surrounding at least a part of the planar portion in a plan view;
a front cover layer disposed on the base substrate;
a flat cover layer overlapping the planar portion and disposed on the base substrate; and
a bending cover layer overlapping the curved portion and disposed on the base substrate and not overlapping the planar portion,
wherein the front cover layer and the bending cover layer each include an inorganic material.

2. The window of claim 1, wherein the front cover layer is disposed between the base substrate and the flat cover layer and between the base substrate and the bending cover layer.

3. The window of claim 2, further comprising:
an anti-reflection layer disposed between the base substrate and the front cover layer.

4. The window of claim 2, further comprising:
a functional layer disposed on the flat cover layer and the bending cover layer,
wherein the functional layer includes at least one of an anti-fingerprint layer and an antistatic layer.

5. The window of claim 2, further comprising:
a lower cover layer overlapping the curved portion and disposed below the base substrate,
wherein the lower cover layer includes an inorganic material.

6. The window of claim 5, further comprising:
a coating layer disposed below the planar portion and the lower cover layer.

7. The window of claim 1, wherein the front cover layer is disposed on the flat cover layer and the bending cover layer.

8. The window of claim 7, further comprising:
an anti-reflection layer disposed between the base substrate and the flat cover layer and between the base substrate and the bending cover layer.

9. The window of claim 7, further comprising:
a functional layer disposed on the front cover layer,
wherein the functional layer includes at least one of an anti-fingerprint layer and an antistatic layer.

10. The window of claim 7, further comprising:
a lower cover layer overlapping the curved portion and disposed below the base substrate,
wherein the lower cover layer includes an inorganic material.

11. The window of claim 1, wherein
the flat cover layer includes layers having different refractive indices, and
the layers of the flat cover layer are alternately disposed.

12. The window of claim 1, wherein a sum of a hardness of the front cover layer and a hardness of the bending cover layer is about 8 GPa or more.

13. The window of claim 1, wherein each of the front cover layer, the flat cover layer, and the bending cover layer has a thickness in a range of about 500 nm and about 5000 nm.

14. The window of claim 1, wherein
the base substrate comprises a boundary surface between the planar portion and the curved portion and a side surface, and
an angle between the boundary surface and the side surface is about 90 degrees or less.

15. The window of claim 1, wherein a thickness of the curved portion varies as a distance from the planar portion varies.

16. The window of claim 1, wherein the inorganic material includes one of silicon nitride, silicon oxide, and aluminum oxide.

17. A method of manufacturing a window, the method comprising:
providing a base substrate including a planar portion and a curved portion which surrounds at least a part of the planar portion;
forming a front cover layer covering the planar portion and the curved portion;
forming a flat cover layer on the front cover layer using a first mask including a first opening that overlaps the planar portion, the flat cover layer overlapping the planar portion; and
forming a bending cover layer on the front cover layer using a second mask including a second opening that overlaps at least a part of the curved portion, the bending cover layer overlapping the curved portion.

18. The method of claim 17, wherein
the front cover layer and the bending cover layer each include an inorganic material, and
a hardness of the curved portion is greater than a hardness of the planar portion.

19. The method of claim 18, wherein the forming of the flat cover layer includes:
forming layers having different refractive indices; and
disposing the layers of the flat layer alternately with each other.

20. The method of claim 17, wherein a sum of a hardness of the front cover layer and a hardness of the bending cover layer is about 8 GPa or more.

21. The window of claim 1, wherein:
the flat cover layer does not overlap the curved portion.

22. The window of claim 1, wherein:
the bending cover layer comprises a first material; and
the first cover layer comprises a second material different from the first material.

23. The window of claim 1, wherein:
the curved portion comprises:
a first portion and a second portion, each extending in the first direction from the planar portion and spaced apart from each other in the first direction with the planar portion interposed therebetween; and
a third portion and a fourth portion, each extending in the second direction from the planar portion and spaced apart from each other in the second direction with the planar portion interposed therebetween, and
the first to fourth portions extend continuously.

* * * * *